US007949985B2

(12) United States Patent
Moroz et al.

(10) Patent No.: US 7,949,985 B2
(45) Date of Patent: May 24, 2011

(54) METHOD FOR COMPENSATION OF PROCESS-INDUCED PERFORMANCE VARIATION IN A MOSFET INTEGRATED CIRCUIT

(75) Inventors: Victor Moroz, Saratoga, CA (US); Dipankar Pramanik, Saratoga, CA (US); Kishore Singhal, Milpitas, CA (US); Xi-Wei Lin, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/757,338

(22) Filed: Jun. 1, 2007

(65) Prior Publication Data
US 2008/0297237 A1 Dec. 4, 2008

(51) Int. Cl.
G06F 9/455 (2006.01)
G06F 17/50 (2006.01)
G06F 11/22 (2006.01)

(52) U.S. Cl. ........................................ 716/136; 716/132

(58) Field of Classification Search .............. 716/2, 4–5, 716/132, 136
See application file for complete search history.

(56) References Cited

U.S. PATENT DOCUMENTS

| 3,882,391 | A | 5/1975 | Liles et al. | |
|---|---|---|---|---|
| 4,138,666 | A | 2/1979 | Eichelberger et al. | |
| 5,412,263 | A | 5/1995 | Nagaraj et al. | |
| 5,748,534 | A | 5/1998 | Dunlap et al. | |
| 6,563,017 | B2 | 5/2003 | Muramatsu et al. | |
| 7,263,477 | B2* | 8/2007 | Chen et al. | 703/13 |
| 7,441,211 | B1* | 10/2008 | Gupta et al. | 716/2 |
| 2004/0060020 | A1* | 3/2004 | Pramanik et al. | 716/6 |
| 2004/0139405 | A1* | 7/2004 | Mori et al. | 716/2 |
| 2005/0144576 | A1* | 6/2005 | Furuta et al. | 716/4 |
| 2006/0101355 | A1* | 5/2006 | Ciplickas et al. | 716/2 |
| 2006/0107243 | A1* | 5/2006 | Chlipala et al. | 716/4 |
| 2006/0142987 | A1* | 6/2006 | Ishizu et al. | 703/14 |
| 2007/0028195 | A1* | 2/2007 | Chidambarrao et al. | 716/2 |
| 2008/0195983 | A1* | 8/2008 | Chidambarrao et al. | 716/2 |

OTHER PUBLICATIONS

Filanovsky et al.; "Mutual Compensation of Mobility and Threshold Voltage Temperature Effects with Applications in CMOS Circuits"; Jul. 2001; IEEE; pp. 1-9.*
Nassif, Sani; "Modeling and Forcasting of Manufacturing Variations"; Jun. 2000; IBM Austin Research Laboratory; pp. 1-9.*
Ding et al.; "Impact of Process Variations on Soft Error Vulnerability for Nanometer VLSI Circuits"; Oct. 2005; Department of Electrical Engineering, Tsinghua University; pp. 1-4.*
International Search Report for PCT/US 08/51355 dated May 20, 2008.
Griffin, P. B. et al., "Process Physics Determining 2-D Impurity Profiles in VLSI Devices," IEEE, 1986, pp. 522-525.
H. Fukutome et al., "Direct Measurement of Effects of Shallow-Trench Isolation on Carrier Profiles in Sub-50 nm N-MOSFETSs," 2005 Symposium on VLSI Technology Digest of Technical Papers, pp. 140-141.
Moroz, Victor et al., "Suppressing Layout-induced Threshold Variations by Halo Engineering," presented at 210th meeting of the Electrochemical Society, Cancun, Mexico, Oct. 29-Nov. 3, 2006, 6 pp.

* cited by examiner

Primary Examiner — Sun J Lin
Assistant Examiner — Suresh Memula
(74) Attorney, Agent, or Firm — Kenta Suzue; Haynes Beffel & Wolfeld LLP

(57) ABSTRACT

An automated method for compensating for process-induced variations in threshold voltage and drive current in a MOSFET integrated circuit. The method's first step is selecting a transistor for analysis from the array. The method loops among the transistors of the array as desired. Next the design of the selected transistor is analyzed, including the steps of determining threshold voltage variations induced by layout neighborhood; determining drive current variations induced by layout neighborhood. The method then proceeds by attempting to compensate for any determined variations by varying the length of the transistor gate. The method can further include the step of identifying any shortcoming in compensation by varying contact spacing.

12 Claims, 8 Drawing Sheets

METHOD FOR COMPENSATION OF PROCESS-INDUCED PERFORMANCE VARIATION IN A MOSFET INTEGRATED CIRCUIT

BACKGROUND

The invention relates to integrated circuit devices, and more particularly to the compensation for performance variations in a transistor array.

In traditional integrated circuit design, a designer could count on the performance characteristics of a MOSFET gate as being determined by the width and length of the channel.

Here it should be clearly understood that "performance characteristics" as used herein corresponds to the general understanding of that term by those in the art. Specifically, that term comprehends both the drive current and threshold voltage of a MOSFET under design.

With the advent of sub-100 nm feature sizes, coupled with techniques such as strain engineering (as seen in U.S. patent application Ser. No. 11/291,294, entitled "Analysis of Stress Impact on Transistor Performance", filed 1 Dec. 2005, owned by the assignee hereof and hereby incorporated herein), it has been found that additional variations occur, caused by the proximity of neighboring elements in the integrated circuit array, such as other MOSFET elements, contacts and the like.

Current design techniques cannot cope with such variations in an efficient manner. Normally, designers operate by simulation to lay out a MOSFET integrated circuit, and the first knowledge of unexpected variations generally is the failure of the actual circuit, after the prototypes are fabricated in silicon. That situation requires expensive and time-consuming redesign efforts. The art has thus created an opportunity to achieve more convenient and efficient designs by providing methods and systems for addressing the issue of process-induced variations.

SUMMARY

An aspect of the invention is an automated method for compensating for process-induced variations in threshold voltage and drive current in a MOSFET integrated circuit. The method's first step is selecting a transistor for analysis from the array. The method loops among the transistors of the array as desired. Next the design of the selected transistor is analyzed, including the steps of determining threshold voltage variations induced by layout neighborhood; determining drive current variations induced by layout neighborhood. The method then proceeds by attempting to compensate for any determined variations by varying the length of the transistor gate. The method can further include the step of identifying any shortcoming in compensation by varying contact spacing.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
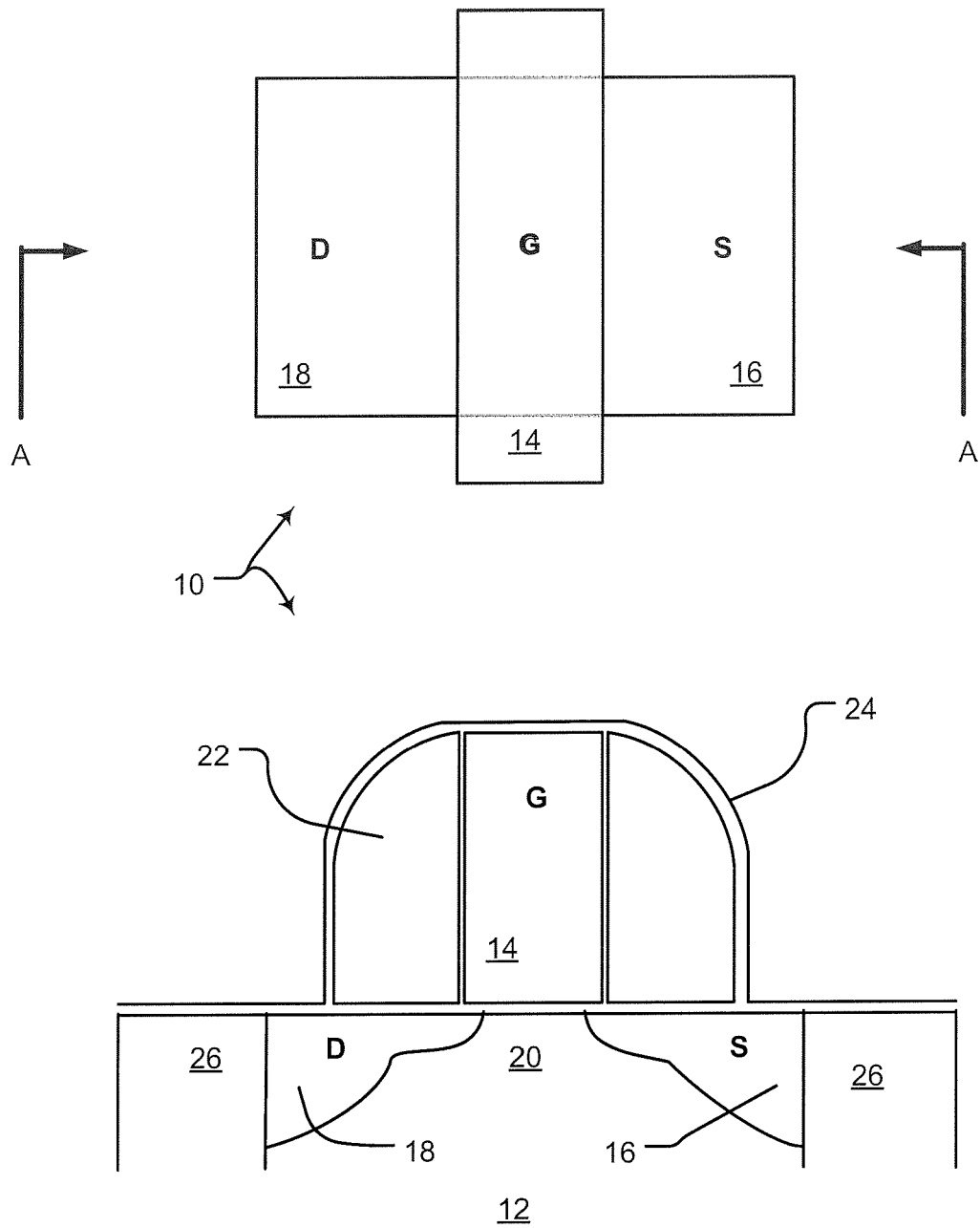
FIG. 1 illustrates a MOSFET transistor, showing the sources of stress-related performance variation.

The claimed invention can best be understood by first considering an illustrative MOS transistor 10, shown in FIG. 1, which shows both a plan view (upper portion) and a cross-section taken on line A-A (bottom portion). There, a diffusion region 12 includes a source region 16 and drain region 18 formed in the diffusion region, with a gap between these regions overlain by a gate 14. The area under the gate is the channel 20. Spacers 22 lie on either side of the gate (not shown in plan view), and a nitride cap layer 24 is formed over the entire structure. The MOSFET is electrically separated from surrounding elements by Shallow Trench Isolation (STI) areas 26, formed on either side of the transistor, generally having of oxide-based insulating material. It will be understood that materials and fabrication techniques relating to these components, and to the MOS device as a whole, are wholly known in the art and are thus not described in any detail here. It is anticipated that the array would be formed in a Partially Depleted, Silicon-on-Insulator (PDSOI MOSFET) substrate, but the teachings of the present application apply to bulk configurations as well. It will be noted that the drawings depict bulk MOSFET devices.

As noted in the references cited above, a number of these construction elements cause mechanical stresses of one kind or another, which in turn induce performance variations flowing from the piezoelectrical properties of the Si and other materials. For example, differential shrinkage rates of the Si, nitride cap layer and STI material can impose various stresses, as can the channel dopant. The process of dealing with such stresses is described in the cited patent, and is referred to as "strain engineering."

Figure 2A:
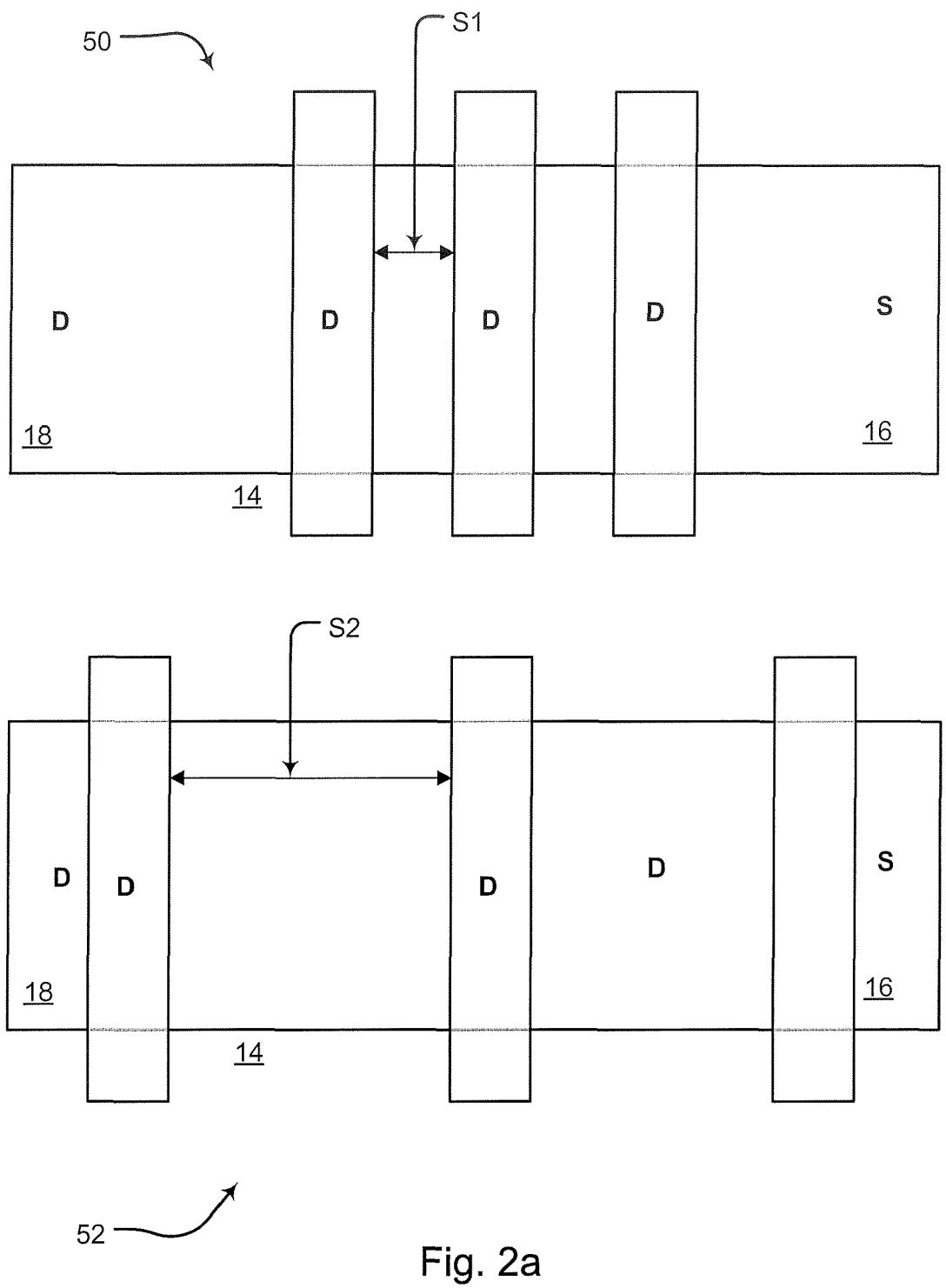
FIG. 2a is a plan view of a portion of an integrated circuit layout.

The first aspect of the situation facing developers of sub-100 nm systems can be seen in FIG. 2a. There, two MOSFET integrated circuits 50 and 52 are shown in plan view, each having three gate areas 14 overlying a diffusion area in which source and drain regions 16 and 18 are formed. The polysilicon gates have the same width and length, and are identical in composition. The only difference is that the gates of array 50 are spaced relatively narrowly, at a pitch of S1, while those of array 52 are more widely spaced, at a distance S2. Under conventional design and analysis, both would exhibit the same performance characteristics of drive current and threshold voltage.

Figure 2B:
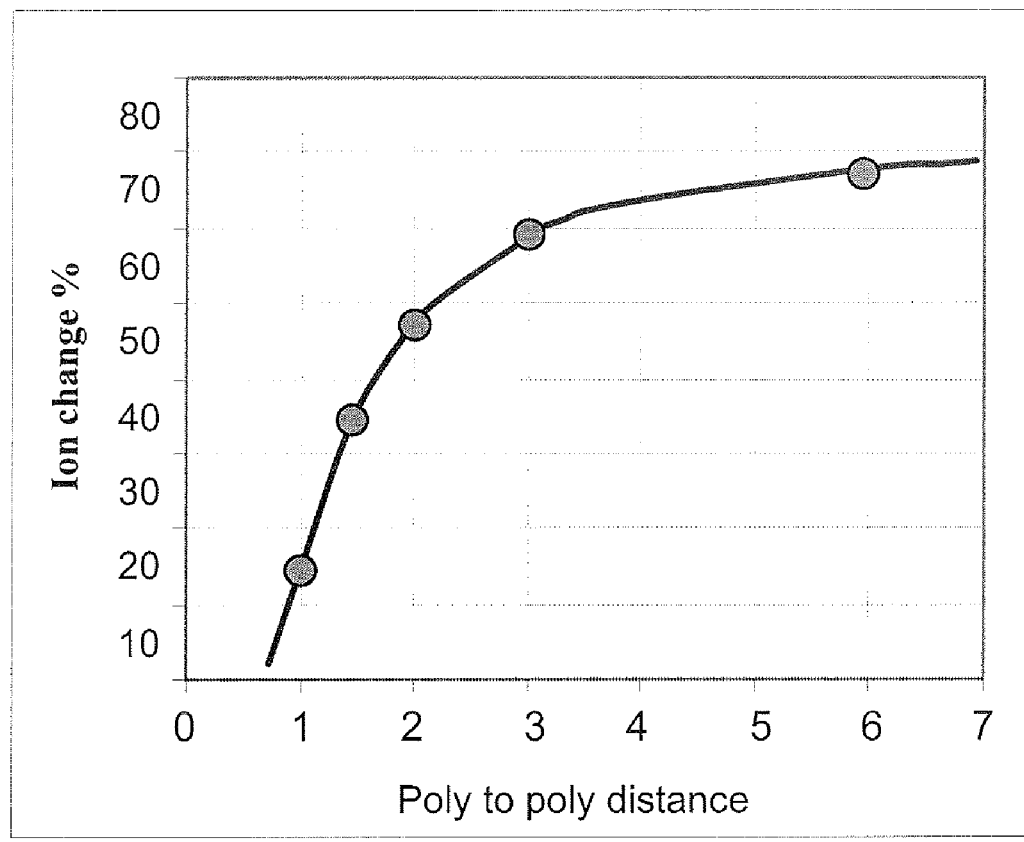
FIG. 2b is a chart plotting MOSFET performance as a function of gate spacing.

Yet, as shown in FIG. 2b, that result does not occur. As shown in the chart, which plots ion change as a function of poly-to-poly distance, ion change (that is, change in current flow, which here consists of holes) is markedly enhanced by increased spacing, with the differential particularly steep at low levels. Thus, the designer who expects the arrays of FIG. 2a to perform identically will be very surprised at the results, which will differ significantly.

Figure 3:
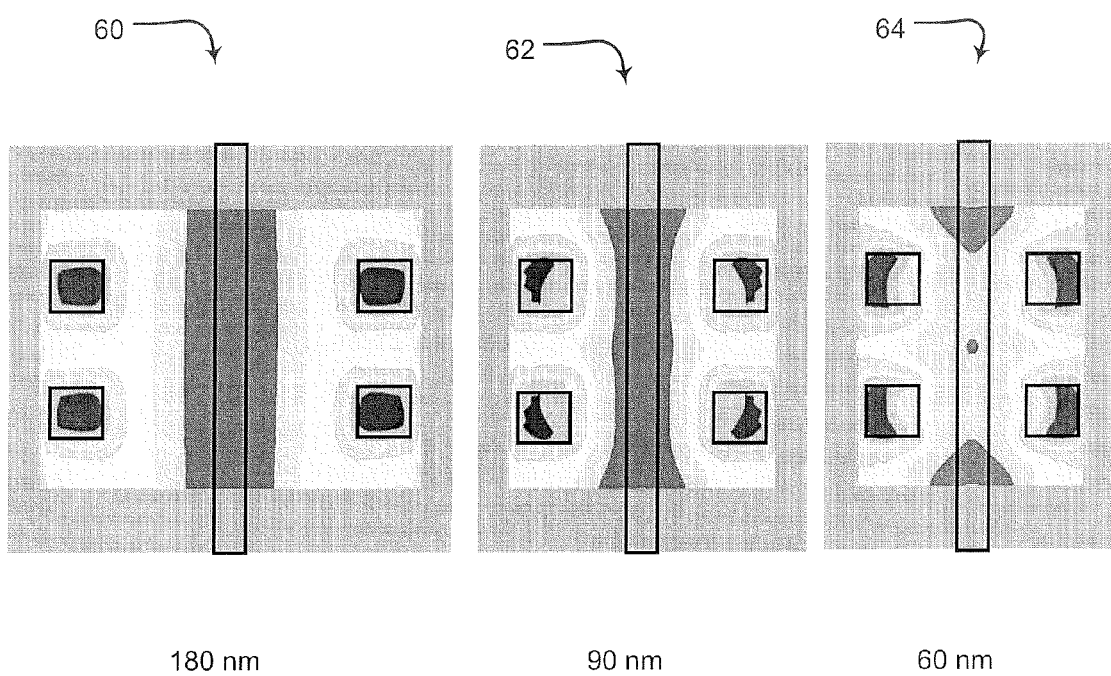
FIG. 3 illustrates three MOSFET transistors, having different contact spacing, with the resulting stress patterns plotted.

A second issue is shown in FIG. 3, which depicts three MOSFET transistors, each having identical gates formed over identical diffusion areas. Here, however, the contacts are spaced at different distances from the gates, with the four contacts of MOSFET 60 located at 180 nm from the gate, with those of MOSFET 62 at 90 nm and MOSFET 64 at 60 nm. Looking at the stress plot of transistor 60, one sees a uniform stress across the channel area, while that of transistor 62 shows some variation and transistor 64 is highly different, having the high stress concentrated solely at the ends of the channel, not distributed relatively uniformly. As taught by the cited patent application, differing stress leads to differing performance. Again, conventional design techniques would treat these three transistors as being identical and would expect identical results. The result would be highly surprising and possibly disastrous.

Figure 4:
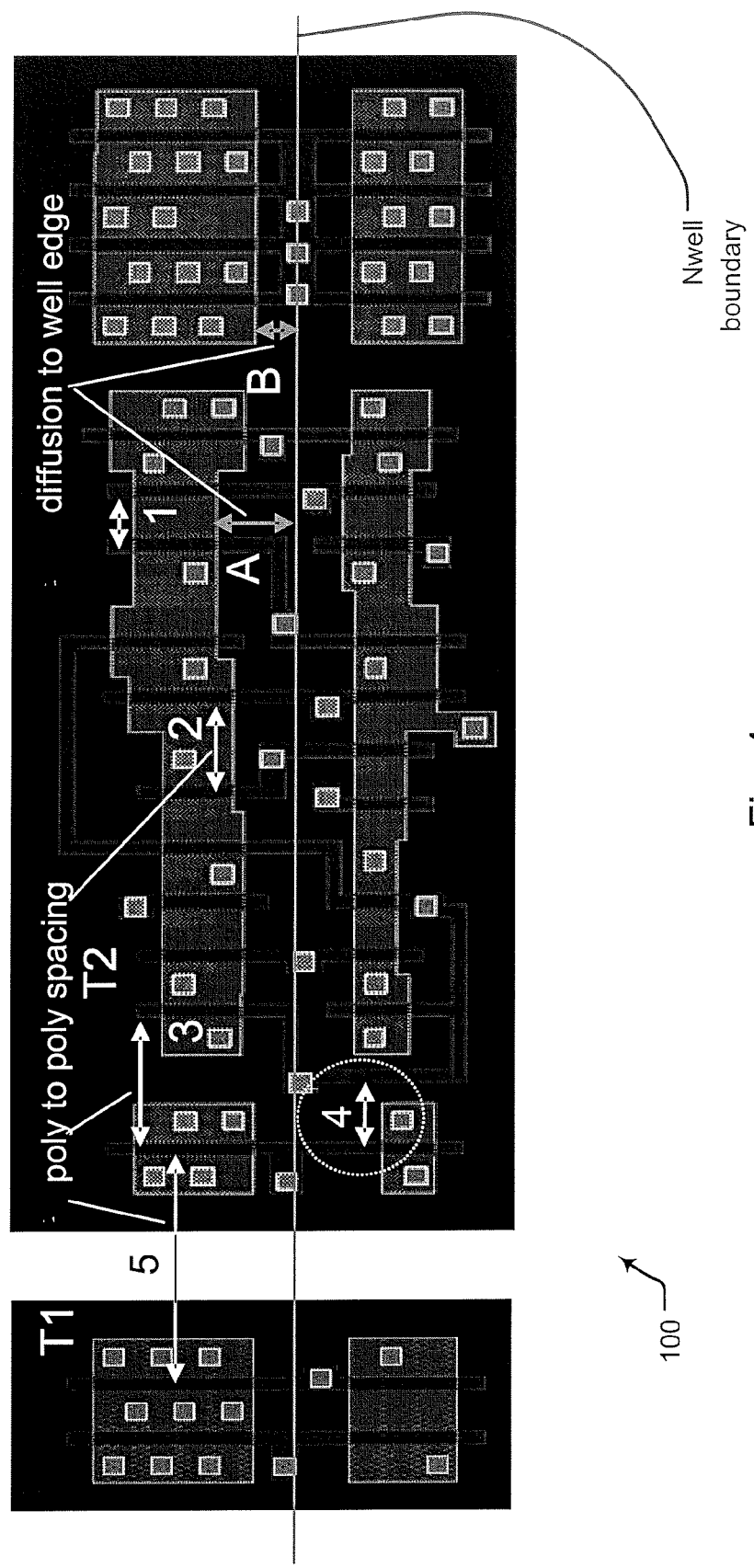
FIG. 4 depicts a larger portion of an integrated circuit, showing the various types of process-induced variation.

FIG. 4 depicts a larger portion of an actual MOSFET integrated circuit. This drawing includes two chip surface areas, separated by an STI, with multiple diffusion areas. As is known in the art, chip areas can include areas of differing type material, referred to as n-wells or p-wells, with the employment of both forms facilitating the CMOS architecture. Here, the bottom portion of the two areas are n-wells, with the boundary indicated. It has been found that the distance from a diffusion area to a well boundary affects performance, in a manner analogous to the effect produced by differing poly spacing, except that it affects MOSFET threshold voltage instead of the ion change. Thus, the distance variations shown by the vertical arrows A and B in FIG. 4 can be expected to produce effects similar to but separate from those of poly spacing and contact spacing.

FIG. 4 also illustrates the complexity of a typical design, with some different poly spacings shown by the horizontal arrows 1-5, and the observable multiple differences in contact spacing.

Each of these effects can be reduced to a model through experimentation with a test design, producing a relationship that can be employed to indicate potential problems and calculate compensatory mechanisms. The results of such a model can be seen in the chart of FIG. 5*c* showing the relationship between poly spacing and ion change obtaining in the embodiment of FIG. 4. Similar models can be obtained for contact spacing and n-well boundary distance.

In addition to the models discussed above, other variations may be uncovered by careful investigation following the principles set out here, and such variations can be reduced to models and analyzed in a manner identical to that set out here. Such embodiments of the invention would fall squarely within the spirit of the invention, as set out in the claims appended below.

All of the variations discussed above, as well as those whose existence may be uncovered by similar methods heretofore, stem from process variables, such as poly spacing, rather than from any inherent property of the materials or elements themselves. Thus, such variations are referred to herein as "process-induced" variations, distinguishing them from variations resulting from other sources.

Figure 5A:
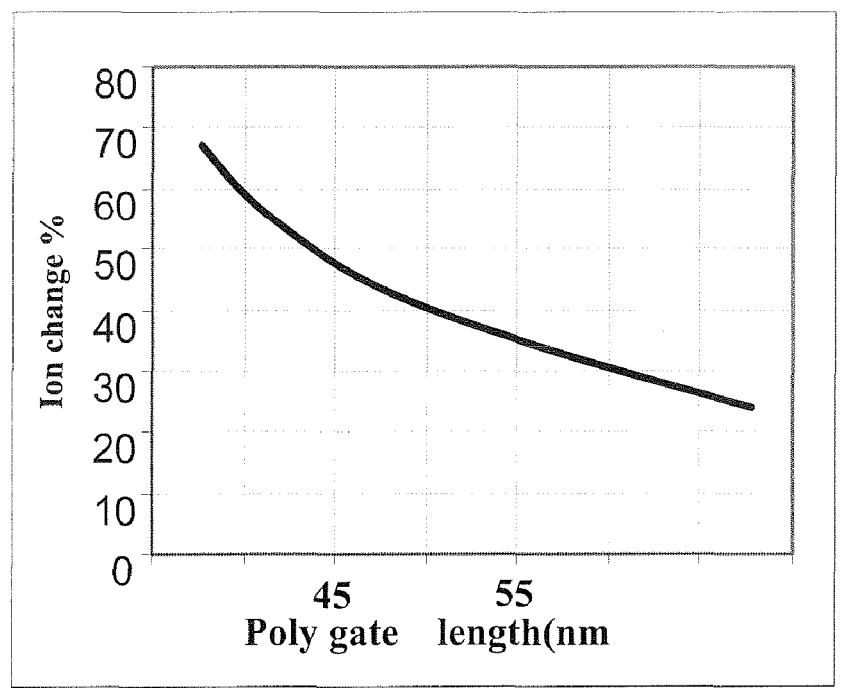
FIGS. 5a-5c are charts plotting gate length against ion change, poly spacing against ion change, and a combination of those relationships illustrating the method of the claimed invention.
Figure 5B:
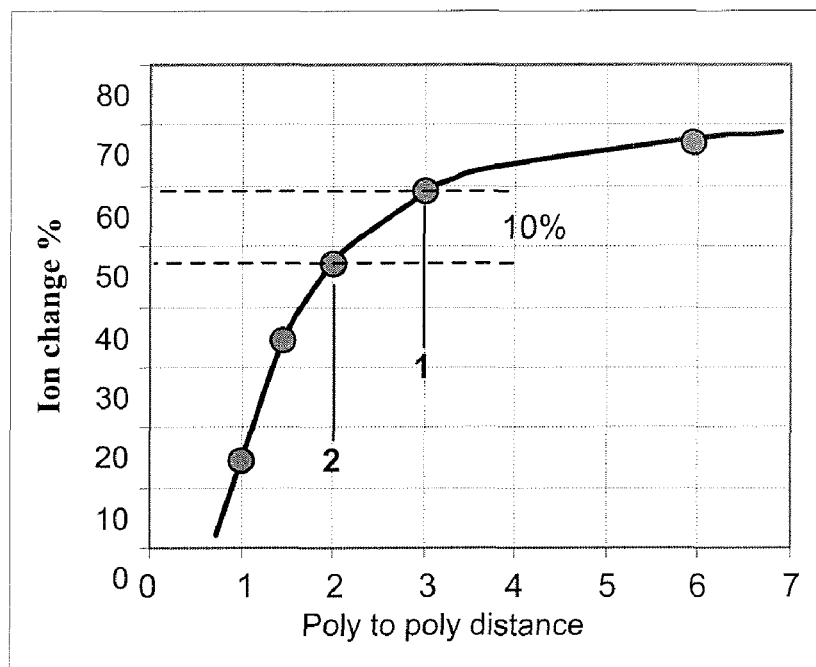
Figure 5C:
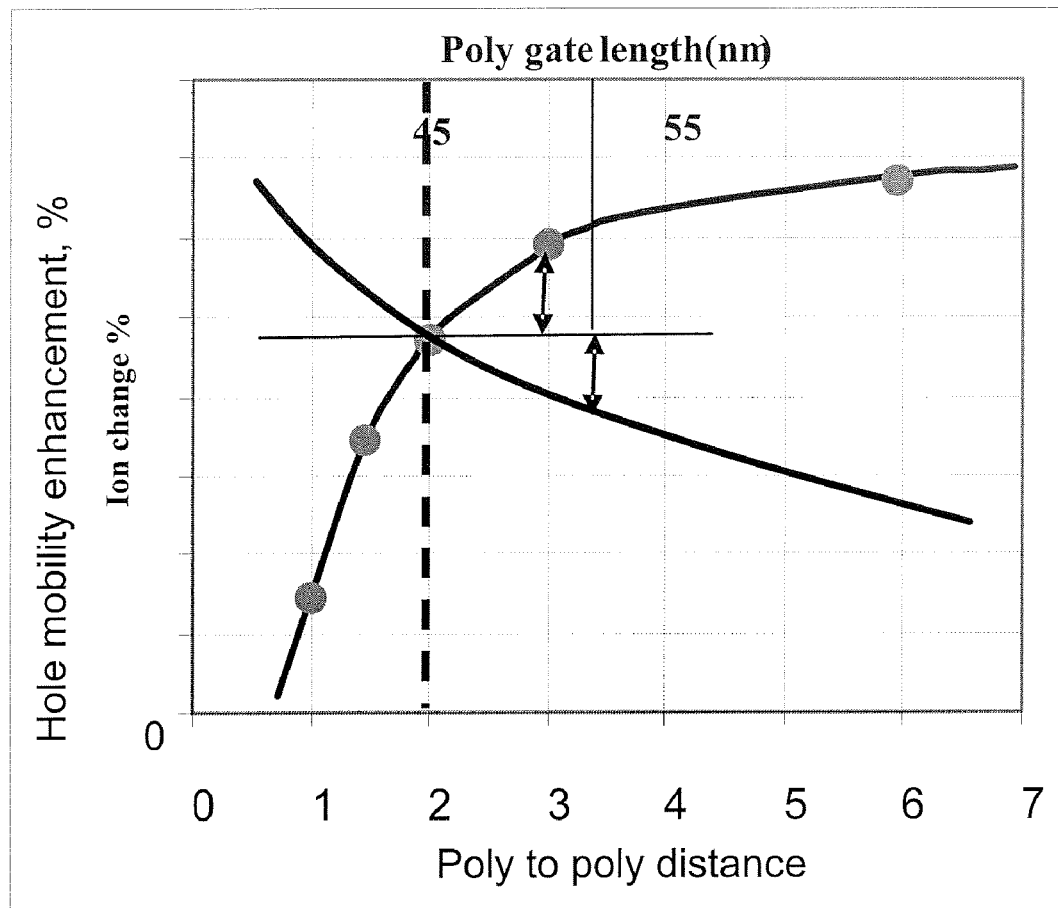

As is known in the art, changes in gate length result in performance changes, as reflected in the curve of FIG. 5*a*. In the practical example of FIG. 4, however, variations in poly spacing lead to performance differences. Taking the practical example of FIG. 4, however, one can see that the poly spacing at exemplary transistors T1 and T2 is different, having values that can be assigned as 2 and 3 units, respectively, as shown in the curve of FIG. 5*b*, which locates these transistors on the curve previously shown in FIG. 2*b*. Assuming that the performance characteristic of transistor T2 represents the standard value used in the overall design, then it can be seen that the performance of transistor T1 will be some 10% higher, a significant variation. Carrying such analysis across the device shows the problems of relying on conventional analysis.

The present invention uses the relationships of FIGS. 5*a* and 5*b* together to compensate for such variations. FIG. 5*c* shows both the variation due to poly spacing, on the bottom axis, and that due to gate length on the top axis, and the intersecting curves. Based on the note above that the performance of T2 was chosen as a reference point in the design, it can be seen that the gate length of that device is 45 nm. As shown by the arrows, however, the increase in performance due to spacing change can be completely offset by increasing the gate length of T1 from 45 to 52 nm, resulting in both devices having the same performance characteristic.

In other words, one can build models of the variations that occur, and then use those variations to compensate for one another, producing a uniform performance from one device to another.

That relationship is here juxtaposed with the variation caused by poly spacing, as shown in FIG. 5*b*, however, to allow a complete compensation for spacing changes.

Figure 6:
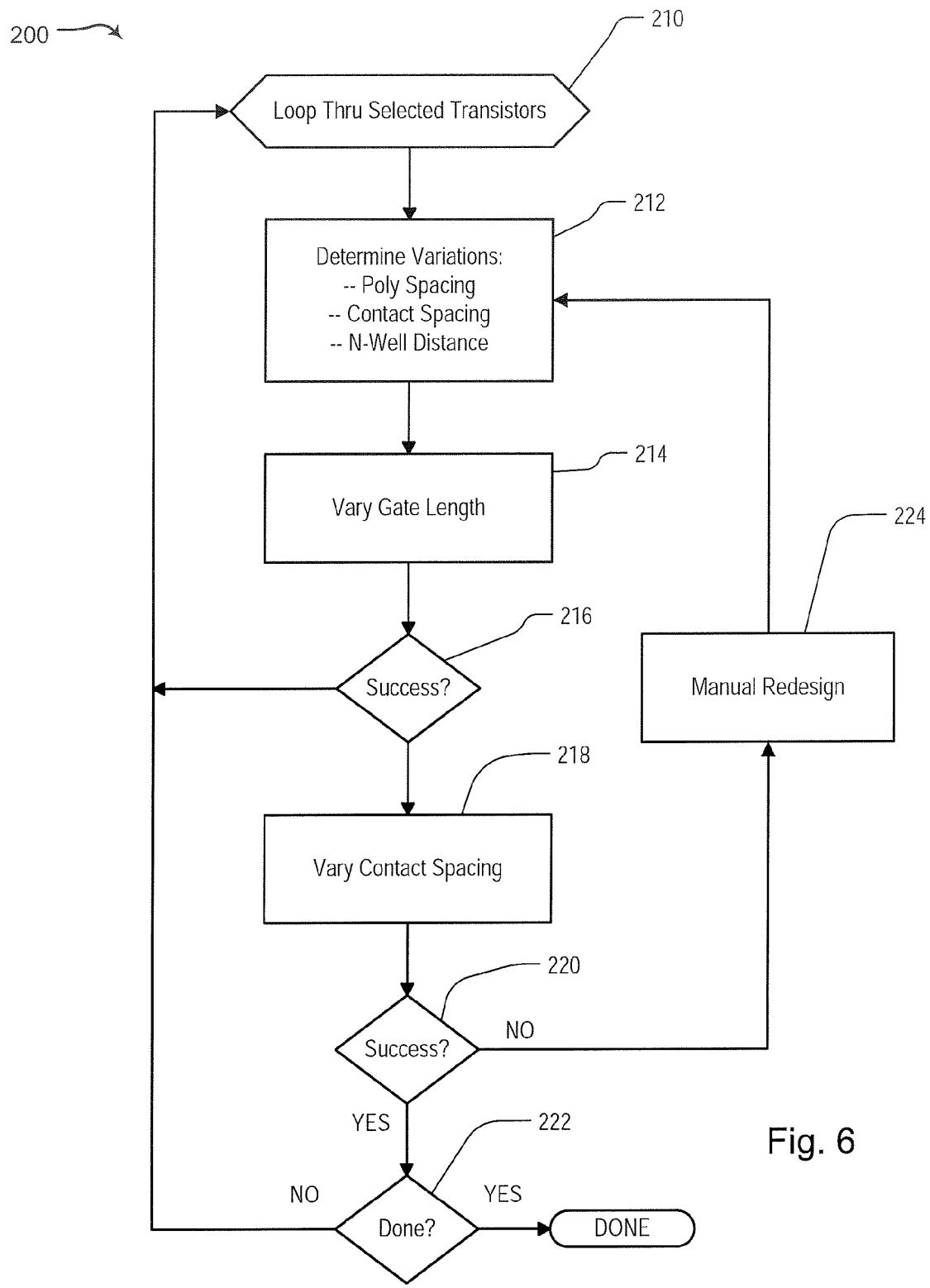
FIG. 6 depicts an embodiment of the claimed process of compensating for process-induced variations.

An embodiment of an automated method 200 to accomplish that result is shown in FIG. 6. This embodiment operates as a portion of an automated integrated circuit design system, such as the SEISMOS software marketed by the assignee hereof. It will be understood that other embodiment can be configured to operate in a standalone mode, or as modules operating within a different design environment. In all such instances, the principles of operation of the claimed system are the same. Such systems are operable on a range of digital computer systems, from personal computers to server-based systems. Selection and operation of such devices is well within the skill of those in the art.

Moreover, it will be appreciated that many of the steps can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied.

First, the computer program controls the process of looping through the transistors of the MOSFET integrated circuit, or selected individual transistors, as indicated by the designer, at step 210. The method begins at step 212, by determining the variations present in the device under analysis, by finding the relevant variable value and then obtaining the corresponding variation amount from the relevant model. For example, in the example of transistor T1 of FIG. 4, discussed above, the system would determine the variation due to poly spacing by determining the relevant poly-to-poly spacing of the gate material, either directly contained in data within the design system, or by operation of a TCAD system participating in the design process.

The process step of determining variations can operate over all known model structures, or the designer can choose to employ only a subset of the models. In any event, the physical value/variation result step 212 continues until the desired variation information is determined.

Then, in step 214, the depicted embodiment proceeds to attempt a compensation by varying the gate length, as was illustrated in connection with FIG. 5*c*. It is expected that the bulk of situations will be susceptible to compensation by altering gate length. Also, this parameter is relatively easy to vary, allowing the compensation to proceed with minimum complication of the fabrication process. If that expected result is achieved, as determined in step 216, the system loops to the next transistor to be tested.

If further compensation is required, the contact spacing can be altered, as shown in step 218. That process proceeds exactly as was seen in FIG. 5c, using the contact spacing model to provide the corrective data. Those data are not shown here, but those in the art will be able to easily obtain the same for specific systems, following to teachings above. The success of that operation is tested in step 220.

In the event that neither automated step is successful in compensating for the expected variation, a manual redesign is required, as shown in step 224. It is necessary to have such a "fail safe" mechanism, of course, but findings to date indicate that the methods set out above should suffice to provide adequate compensation in the vast majority of situations.

An alternate embodiment of the invention would count on the probability that compensating solely for poly spacing, solely by varying gate length, will provide such an improvement over the existing situation, at such low cost, that the secondary considerations and steps could be dispensed with altogether. Other embodiments could use other subsets of the diagnostic and compensatory mechanisms as desired.

The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. An automated method for compensating for process-induced variations in threshold voltage and drive current in an integrated circuit design, comprising the steps of:
   selecting, via a computer system, transistors of the integrated circuit design for analysis;
   analyzing the selected transistors of the integrated circuit design, by determining threshold voltage variations induced by layout neighborhood and determining drive current variations induced by layout neighborhood; and
   mutually offsetting against each other: (i) any determined variations from varying a gate-to-gate spacing of the selected transistors in the integrated circuit design, (ii) any determined variations from varying a contact spacing of the selected transistors in the integrated circuit design; and (iii) any determined variations from varying a gate length of the selected transistors.

2. The method of claim 1, wherein the analyzing step further includes the step of identifying any shortcoming in compensation by varying contact spacing.

3. The method of claim 1, further including the step of continuing to select transistors for analysis until all transistors in the integrated circuit design have been analyzed.

4. The method of claim 1, further including the step of continuing to select transistors for analysis until a selected portion of the transistors in the integrated circuit design have been analyzed.

5. The method of claim 1, wherein said attempting to compensate for any determined variations, also varies a contact spacing of the selected transistors in the integrated circuit design.

6. The method of claim 1, wherein the step of attempting to compensate for any determined variations, continues until a selected portion of the transistors in the integrated circuit design have undergone attempted compensation.

7. A system for compensating for process-induced variations in threshold voltage and drive current in an integrated circuit design, comprising:
   means for selecting transistors of the integrated circuit design for analysis;
   means for analyzing the selected transistors of the integrated circuit design, by determining threshold voltage variations induced by layout neighborhood and determining drive current variations induced by layout neighborhood; and
   means for mutually offsetting against each other: (i) any determined variations from varying a gate-to-gate spacing of the selected transistors in the integrated circuit design, (ii) any determined variations from varying a contact spacing of the selected transistors in the integrated circuit design; and (iii) any determined variations from varying a gate length of the selected transistors.

8. The system of claim 7, wherein the analyzing means further identifies any shortcoming in compensation by varying contact spacing.

9. The system of claim 7, further including the step of continuing to select transistors for analysis until all transistors in the integrated circuit design have been analyzed.

10. The system of claim 7, further including the step of continuing to select transistors for analysis until a selected portion of the transistors in the integrated circuit design have been analyzed.

11. The system of claim 7, wherein said means for attempting to compensate for any determined variations, varies a contact spacing of the selected transistors in the integrated circuit design.

12. The system of claim 7, said means for attempting to compensate for any determined variations, continues until a selected portion of the transistors in the integrated circuit design have undergone attempted compensation.

* * * * *